US009354946B2

(12) United States Patent
Schaarschmidt et al.

(10) Patent No.: US 9,354,946 B2
(45) Date of Patent: May 31, 2016

(54) METHOD FOR COUPLING A CAD SYSTEM TO A DATABASE AND PLANNING SYSTEM FOR INTERCHANGING DATA BETWEEN BOTH SYSTEMS

(71) Applicant: CIDEON Software GmbH & Co. KG, Görlitz (DE)

(72) Inventors: Stefan Schaarschmidt, Bautzen (DE); Andreas Lehmann, Malschwitz (DE); Rolf Lisse, Leverkusen (DE)

(73) Assignee: CIDEON Software GmbH & Co. KG, Görlitz (DE)

( * ) Notice: Subject to any disclaimer, the term of this patent is extended or adjusted under 35 U.S.C. 154(b) by 0 days.

(21) Appl. No.: 14/383,565

(22) PCT Filed: Mar. 6, 2013

(86) PCT No.: PCT/EP2013/054508
§ 371 (c)(1),
(2) Date: Sep. 7, 2014

(87) PCT Pub. No.: WO2013/131958
PCT Pub. Date: Sep. 12, 2013

(65) Prior Publication Data
US 2015/0106824 A1    Apr. 16, 2015

(30) Foreign Application Priority Data
Mar. 7, 2012  (EP) .................................. 12158442

(51) Int. Cl.
G06F 3/00       (2006.01)
G06F 9/44       (2006.01)
G06F 9/46       (2006.01)
G06F 13/00      (2006.01)
G06F 9/54       (2006.01)
G06F 17/50      (2006.01)
G06F 17/30      (2006.01)

(52) U.S. Cl.
CPC ............ G06F 9/54 (2013.01); G06F 17/30271 (2013.01); G06F 17/50 (2013.01)

(58) Field of Classification Search
CPC ........................................................ G06F 9/54
USPC ........................................................ 719/313
See application file for complete search history.

(56) References Cited

PUBLICATIONS

J.P. Kruth, et al., "Extracting process planning information from various wire frame and feature based CAD systems", 1996, 18 pages.*

(Continued)

Primary Examiner — Timothy A Mudrick
(74) Attorney, Agent, or Firm — Reising Ethington P.C.

(57) ABSTRACT

The invention which relates to a method for coupling a CAD system to a database and planning system for interchanging data between both systems is based on the problem of specifying a method for coupling CAD systems to different database and planning systems, which method reduces the outlay in the event of changes and adaptations to different systems. According to the present invention, the problem is solved by virtue of the fact that the conversion between the communication protocols takes place in two substeps in such a manner that the data are converted from the first communication protocol into a third communication protocol in a CAD abstraction layer and are then converted from this third communication protocol into the second communication protocol in a useful layer or vice versa.

7 Claims, 9 Drawing Sheets

(56) References Cited

PUBLICATIONS

Kruth J-P, et al. "Extracting Process Planning Information From Various Wire Frame and Feature Based CAD Systems", Computers in Industry, Elsevier Science Publishers, Amsterdam, NL, vol. 30, No. 2, dated Sep. 30, 1996, pp. 145-162.

Nakamura, I., et al. "A CAD Database Interface Based on Step", IFIP Transactions B. Applications in Technology, Elsevier Science Publishing, Amsterdam, NL, vol. B-10, dated Mar. 15, 1993, pp. 115-129.

Konstantinov G. Ed, Institute of Electrical and Electronics Engineers: "Emerging Standards for Design Management Systems", Computers Standards Evolution: Impact and Imperatives, Washington, Mar. 21-23, 1988; [Proceedings of the Computer Standards Conference (Compstan)], Washington, IEEE Comp. Soc. Press, US, vol CONF. 2, dated Mar. 21, 1988, pp. 16-21.

International Search Report for application No. PCT/EP2013/054508, dated Apr. 2, 2013, 2 pages—translated.

International Search Report and Written Opinion for application No. PCT/EP2013/054508, dated Apr. 2, 2013, 8 pages—not translated.

\* cited by examiner

METHOD FOR COUPLING A CAD SYSTEM TO A DATABASE AND PLANNING SYSTEM FOR INTERCHANGING DATA BETWEEN BOTH SYSTEMS

TECHNICAL FIELD

The invention relates to a method for coupling a CAD system to a database and planning system for interchanging data between both systems, in which case a first CAD-side interface operating with a first communication protocol and a second database-side interface operating with a second communication protocol are provided, and in which case the data to be transmitted are converted from the first communication protocol to the second communication protocol or vice versa between the first and second interfaces.

BACKGROUND

Methods for coupling CAD applications to database and/or planning systems such as SAP (SAP GmbH data-processing systems, applications and products) according to the prior art are implemented, for example, using a CAD-side first interface, a database-side second interface and a software or interface module arranged between both interfaces. In this case, the module is specifically geared to coupling two specific systems. So-called programming interfaces (API—application programming interface) provided by the manufacturer are usually used as interfaces, for example.

If, on the one hand, the CAD system or, on the other hand, the database and/or planning system changes, the interposed module must be reprogrammed in order to provide the desired functionality again after a change. This reprogramming may affect parts or the entire module.

Such CAD integrations have already existed at least since the 1990s. CIDEON Software also already has many years of experience with CAD interface modules to SAP and other systems. The application "AutoORG STL" existed, on the one hand, as an interface module from AutoCAD to a separate dBase-based or Oracle-based database and, on the other hand, as an interface module to SAP. "AutoORG STL" was certified by SAP in 1996. CIDEON Software subsequently developed further interface modules to systems such as Baan PDM, AMS and ProALPHA.

The modules were implemented as AutoCAD ARX modules. The integrations thus established a permanent connection between a CAD system and a database and/or planning system (also called a back-end system). For a new CAD version, sometimes even for a new service pack of the CAD system, the interface modules had to be at least recompiled or possibly adapted in terms of programming. Connecting a new CAD system always required redevelopment of the integration.

Such interface modules have disadvantages such as a large amount of programming and testing effort for each change or each new coupling variant.

SUMMARY

An object of the invention is to provide a method for coupling CAD systems to different database and planning systems, which method reduces the amount of effort in the event of changes and adaptations to different systems.

In a method for coupling CAD systems of the type mentioned at the outset, the object is achieved, according to the invention, by virtue of the fact that the conversion between the communication protocols is carried out in two substeps in such a manner that the data are converted from the first communication protocol in a CAD abstraction layer to a third communication protocol and are then converted from this third communication protocol to the second communication protocol in a useful layer or vice versa.

In the present description, a communication protocol is understood as meaning, for example, a COM, NET, ObjectARX, MDL, WebService or Lisp API.

According to the invention, the conversion of the data is subdivided into two or more substeps or areas. It is therefore possible, for example when replacing the database and/or planning system coupled according to the method, that only the substep which converts the data between the second communication protocol of the second database-side interface and the third communication protocol has to be adapted to the communication protocol of the new database and/or planning system. The substep to be implemented in the useful layer therefore needs to be adapted. The substep of converting the data from the third communication protocol to the first communication protocol, which takes place in the CAD abstraction layer, can therefore be retained without change. If this substep has been subdivided, for example, into further sub-substeps, all of these sub-substeps can be retained without change.

One refinement of the invention provides for further intermediate steps for adapting the communication by means of communication libraries to be inserted when converting the data from the third communication protocol to the second communication protocol or vice versa.

According to the invention, a conversion substep can also be subdivided into further substeps. A further conversion substep may be provided, for example, in a module optionally arranged between the database and/or planning system and the useful layer.

Another refinement of the invention provides for the conversions between the communication protocols to be carried out taking into account further CAD-specific or customer-specific specifications.

In addition to the general specifications for converting the data between the communication protocols in the useful layer and/or in the CAD abstraction layer, there may be further additional specifications which enable adaptation to customer-specific or CAD-specific specifications or additional options.

The basic idea is to provide an interface module according to the invention in the form of a so-called "virtual" CAD API. The latter is abstracted from an underlying CAD system, for example SolidWorks, MicroStation, Autodesk Inventor, Solid Edge, AutoCAD or CATIA.

The useful layer based on this then provides its functionality on the basis of the virtual CAD API. It therefore establishes a connection between the virtual CAD and the back-end system.

An integration in a further "superordinate" back-end system substantially involves, according to the invention, creating or adapting a further useful layer.

An integration in a further "underlying" CAD system substantially involves creating or adapting a further CAD abstraction layer.

According to the present invention, the effects and advantages cited below therefore result:

Independence from CAD-specific characteristics
Independence from technologies used in CAD (COM, Web-Services, Lisp, .NET, etc.)
Independence from differences in the API in different CAD systems (object names, function names, possible parameters)

Independence from differences in the API in different versions of the same CAD system Independence from different forms or add-ons of the same CAD system (AutoCAD Architectural, AutoCAD Electrical, P&ID)

Addition of virtual features which the actually underlying CAD system does not have (parts list functions in standard AutoCAD and in MicroStation, title block functionalities in standard AutoCAD and in MicroStation)

Faster integration of a further CAD system in an already existing integration with the full functionality of the already existing integration. When creating the CAD abstraction layer for a new CAD system, an integration in all back-end systems, for which an integration already exists, is automatically created During integration in a new back-end system, the integration is automatically produced for all CAD systems for which a CAD abstraction layer already exists Identical configuration and identical behavior of the integration for all CAD systems since the business logic layer is identical. Features which are added for an integration are immediately available for all connected CAD systems Reduction in the amount of documentation Reduction in the amount of support Reduction in the amount of testing and more intensive testing of those components which are identical for each CAD integration Even persons without the specific knowledge of inner workings of the CAD system or of the API of the CAD system can implement business logic in the useful layer Functionality can be developed and pretested on computers on which the target CAD system is not installed. Even the API of the target CAD system need not be present.

Some examples of abstracted objects are cited below:

Document, document list: abstraction from the CAD file or a list of the loaded files Component: use of the document in other documents ("occurrence", referencing location)

Field set: set of named attributes such as file attributes, user-defined fields

Project: cross-document combination of documents to form a unit. Examples: Plant 3D project, AutoCAD Electrical project, SheetSet Command, commands: instructions which are provided by the integration and can be called in CAD and can be used in menus, buttons, ribbons, context menus, CAD command lines, scripts and similar instruction callers Title block: a visible area in drawings with named text fields, usually with document information Events: events in CAD such as the opening or storing of a file, the insertion of a title block, or the deletion of a component are received from the CAD system and are forwarded to the connected modules as an event of the virtual CAD system Parts lists: abstraction of the CAD system's own parts lists Object: abstraction of elements and contents of the CAD document such as AutoCAD blocks or MicroStation cells.

BRIEF DESCRIPTION OF THE DRAWINGS

The invention is intended to be explained in more detail below using some exemplary embodiments. In the associated drawings

DETAILED DESCRIPTION OF THE ILLUSTRATED EMBODIMENT(S)

Figure 1:
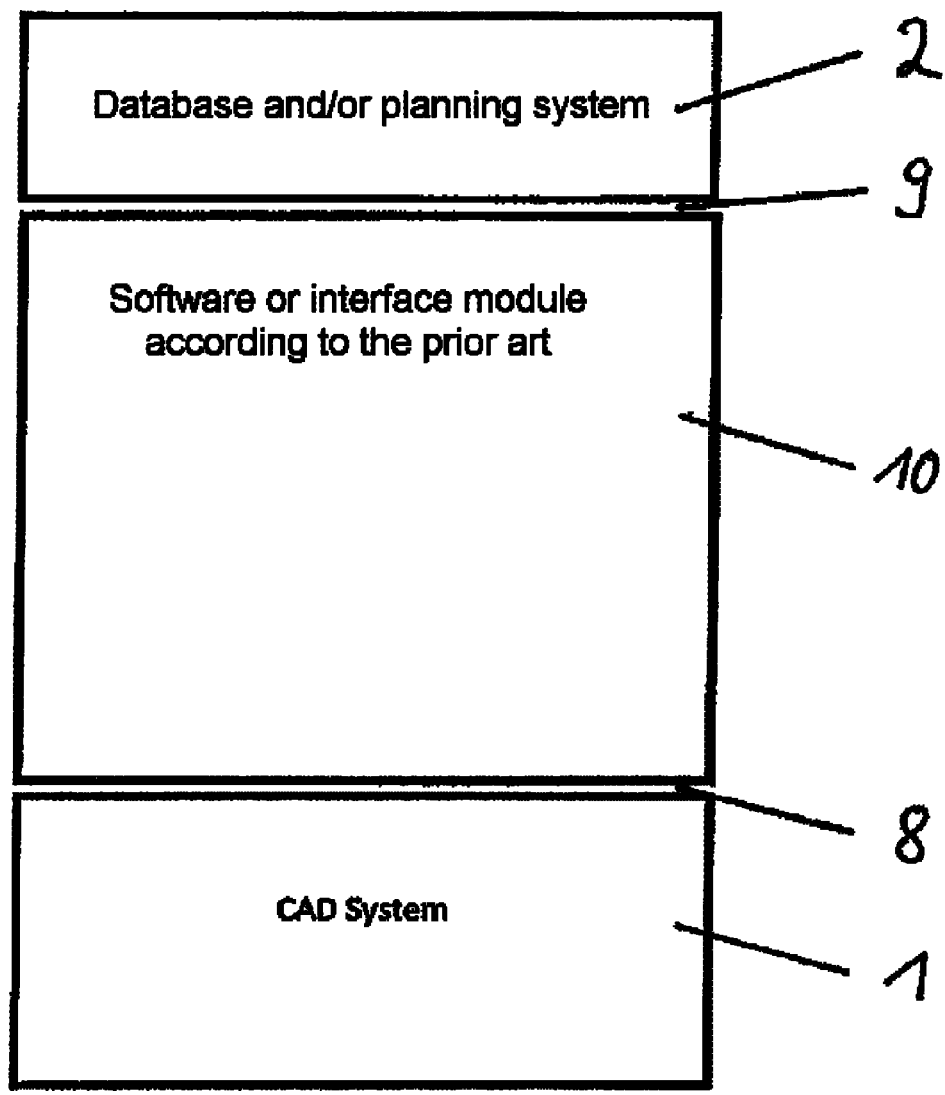
FIG. 1 shows an illustration of a software or interface module according to the prior art arranged between a CAD system and a database and planning system.

FIG. 1 shows a software or interface module 10 according to the prior art which is connected to a CAD system 1 via a first interface 8 and to a database and planning system 2 via a second interface 9. In this case, the module 10 is specifically geared to the connected CAD system 1 and the database and planning system 2.

Figure 2:
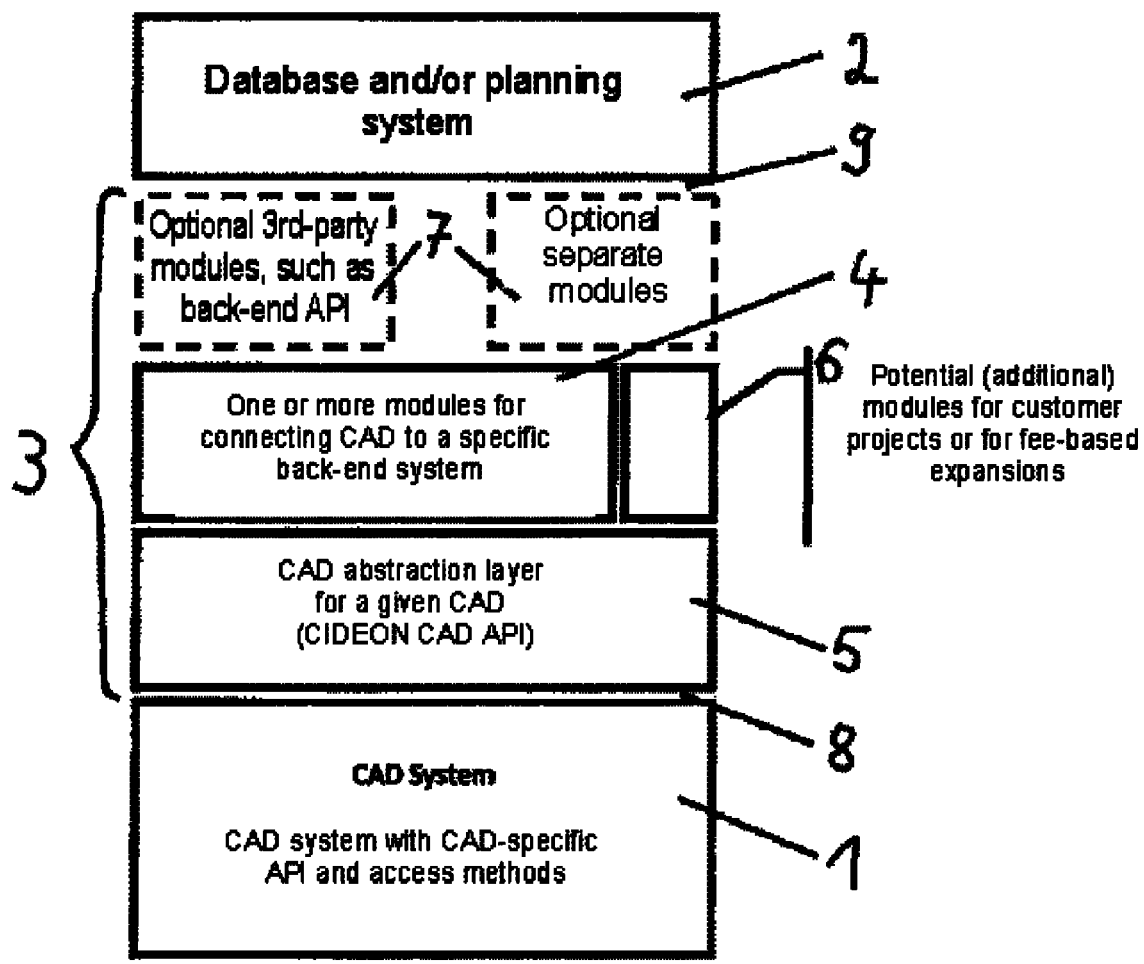
FIG. 2 shows an illustration of the basic architecture of an interface module according to the invention.

FIG. 2 shows a basic illustration of the interface module 3 according to the invention. The latter comprises at least one CAD abstraction layer 5 and a useful layer 4. Said module may also optionally comprise at least one customer-specific additional module 6 and/or a communication library 7.

In FIG. 2, arranged below the interface module 3 according to the invention is the CAD system 1 which is coupled to the database and/or planning system 2 arranged above the module.

The interface module 3 is connected to the CAD system 1 via the first interface 8 and is connected to the database and/or planning system 2 via the second interface 9.

In this case, communication libraries 7 may optionally comprise separate modules or else so-called third-party modules such as a programming interface (back-end API).

The useful layer 4 may comprise one or more modules and implements the connection between the CAD system 1 and the back-end system 2.

The CAD abstraction layer 5 establishes a direct connection to the corresponding CAD system 1.

This basic subdivision of the interface module 3 into the subcomponents of the CAD abstraction layer 5 and useful layer 4 makes it possible to reduce the effort when adapting the range of functions and during adaptation to a new CAD system and/or a new database and/or planning system since a change usually needs to be made only in one of the layers 4 or 5.

Figure 3:
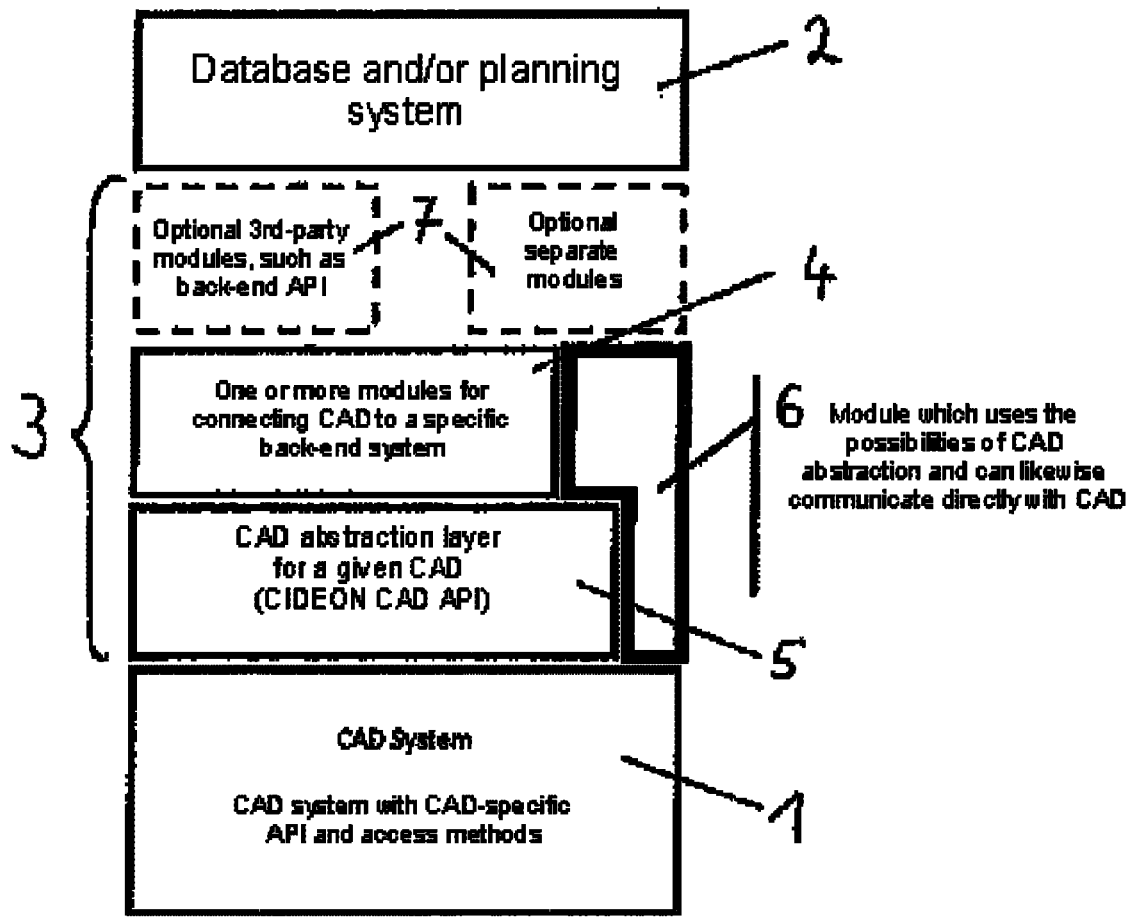
FIG. 3 shows a variation of the interface module for functionalities which are extremely close to CAD or if a specific CAD functionality is not covered in the CAD abstraction layer.

FIG. 3 shows a variation of the interface module 3 in which the function of the customer-specific additional module 6 has been changed with respect to the variant in FIG. 2. In this case, the additional module 6 has both the option of using the CAD abstraction layer 5 and the option of communicating directly with the CAD system 1.

This variation is provided, for example, for functionalities which are extremely close to CAD or if a specific CAD functionality is not covered in the CAD abstraction layer 5.

This additional option provides the advantage that functionalities which are currently not enabled by the CAD abstraction layer can be incorporated within the scope of customer projects.

Figure 4:
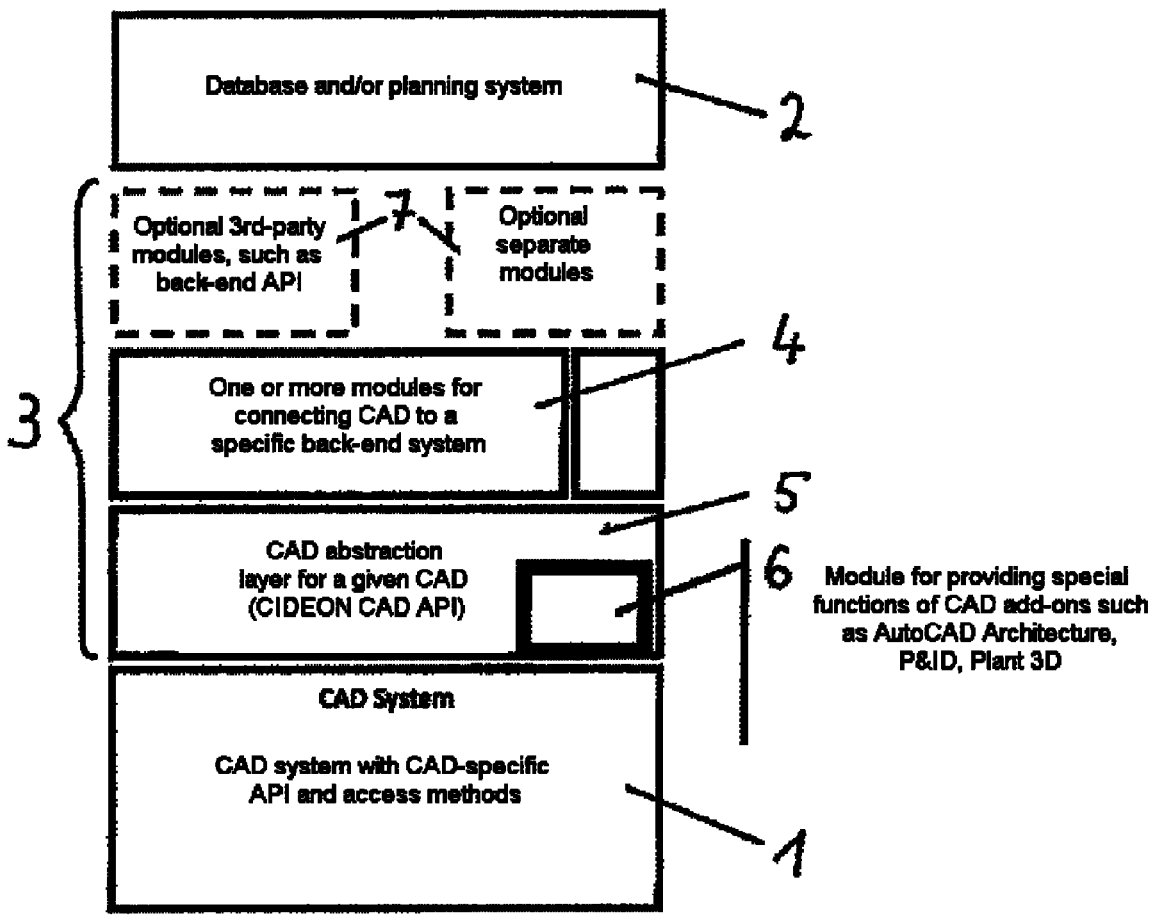
FIG. 4 shows a further variation for supporting forms and add-ons of a CAD system.

FIG. 4 shows a further variation of the interface module 3. In this case, the customer-specific additional module 6 is a component of the CAD abstraction layer 5. This variant is used to support the provision of special functions of CAD add-ons such as AutoCAD Architecture, P&ID or Plant 3D.

Figure 5:
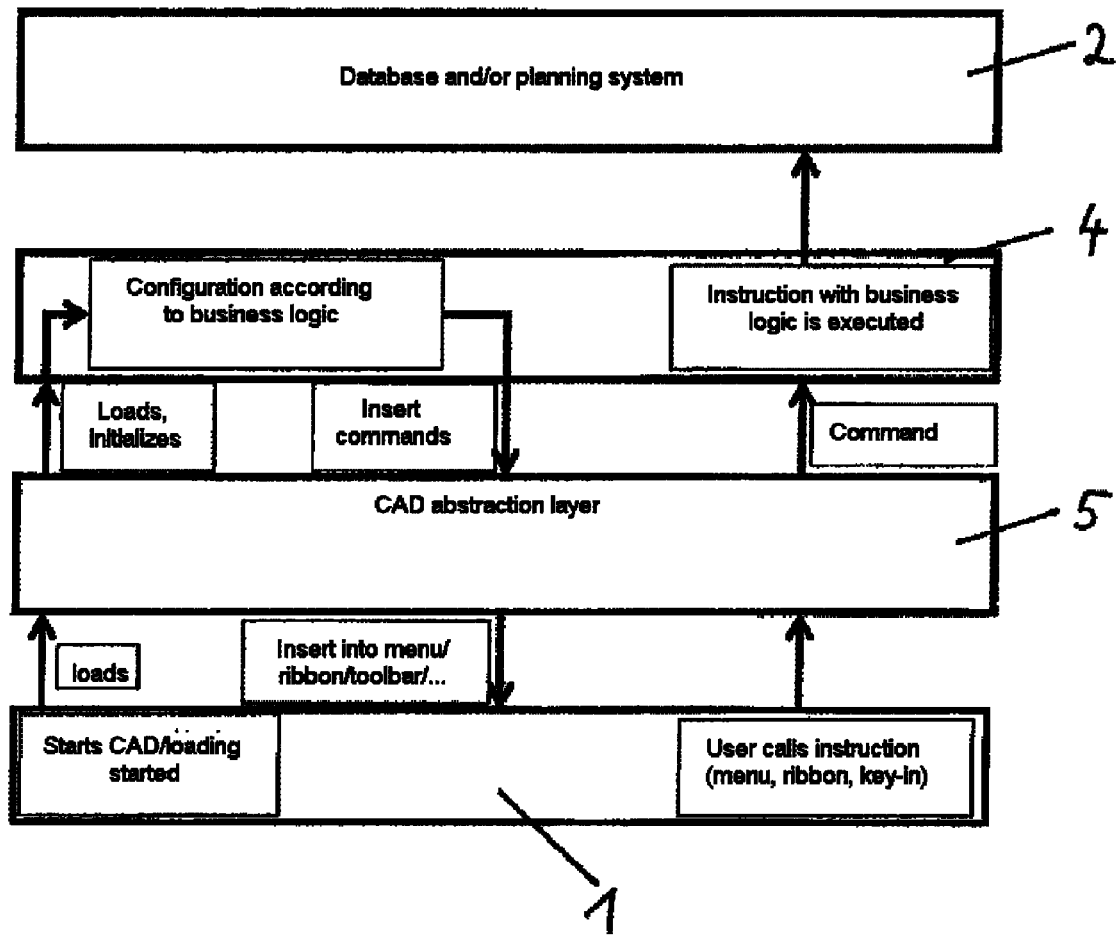
FIG. 5 shows an illustration of the interface module for an exemplary embodiment of the cooperation between different layers of the architecture.

A first example of the interaction between the different layers of the architecture is illustrated in FIG. 5 and is explained below.

In order to prepare the method of operation of the interface module 3, the modules are loaded:

During starting of the CAD system 1 or subsequently on the request of the user or a program, the CAD system 1 loads a CAD module using its loading methods. For example, Inventor loads a registered COM DLL, AutoCAD loads an ARX file using AutoLisp or MicroStation loads an ma file.

The CAD module which contains program parts for expanding the capabilities of the CAD system now in turn loads connected modules. The CAD module need not know these files, but rather these files can be determined dynamically (by registration in COM, using an ini file, using a user selection). These modules have a defined interface for this purpose.

The connected modules are then initialized in FIG. 5.

The modules create abstracted commands which are then divulged by the CAD abstraction layer 5 in the CAD system 1, for example by means of an entry in the CAD menu, by means of insertion into a toolbar or by means of provision as a command which can be called from scripts.

After the preparation by loading the modules has been concluded, the interface module 3 is ready for operation.

The interface module 3 can be used, for example, as described below:

At a subsequent time, a command is used in the CAD system 1. This can be effected by selecting in the menu, clicking in the toolbar, typing in the command line, keying-in, or calling from a script language such as VBA, VSTA or AutoLisp.

The CAD abstraction layer 5 converts the request into a command, as was registered by the connected module, and transmits it to the connected modules. This operation is illustrated in the right-hand part of FIG. 5.

The connected modules then execute the instruction.

Another example shows event handling using the example "create document during storage".

Figure 6:
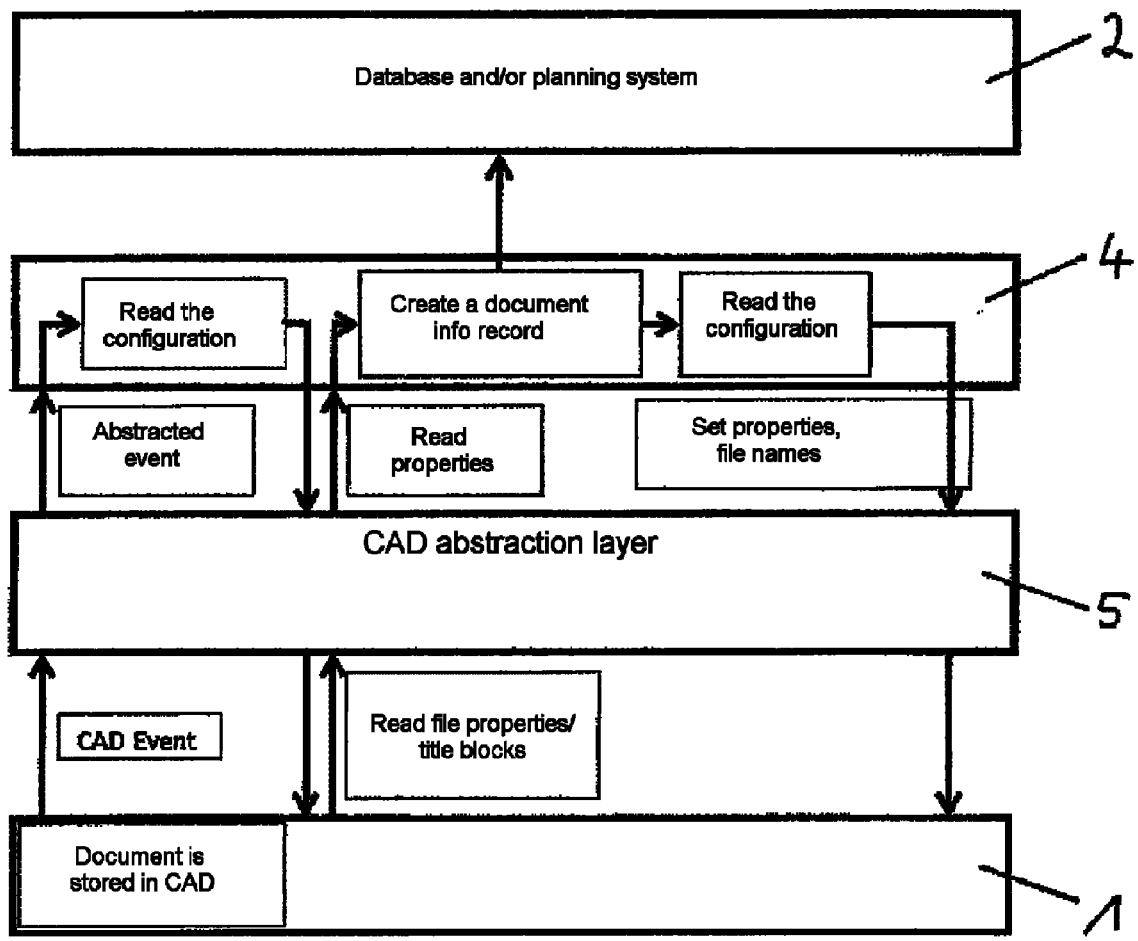
FIG. 6 shows an illustration of the interface module for a further exemplary embodiment for handling events when creating and storing a document.

A CAD system 1 emits events in particular situations, as is illustrated in the left-hand part of FIG. 6. These events are converted into CAD-neutral events by the CAD abstraction layer. The connected modules can process them:

The user triggers storage in the CAD system 1. Alternatively, the storage can also be triggered by a program.

The CAD system transmits a CAD event to the module loaded in CAD.

This module translates the event into a separate event and forwards the latter to the connected modules.

In the useful layer 4, a reaction is now given to said event and a document info record can be created in a configuration-controlled manner, as illustrated in the center of the useful layer 4 in FIG. 6.

If information relating to the affected CAD file is required by the programmed logic or by configuration, properties of the abstracted document are read.

This request is converted into a request relating to the CAD document for the CAD system 1.

The response from the CAD system 1 is translated into neutral properties.

The DIS (document info record) is created.

In order to store the new information relating to the document info record in the CAD file or to allocate a new filename if necessary, the values are allocated to the abstracted document (possibly after reading the corresponding configuration).

The CAD abstraction layer 5 converts this process into the setting of the values in the CAD system 1.

The third example shows the creation/changing/display of the material of a parts list item.

The third example shows the creation/changing/display/use of the material or article of a parts list item.

Figure 7:
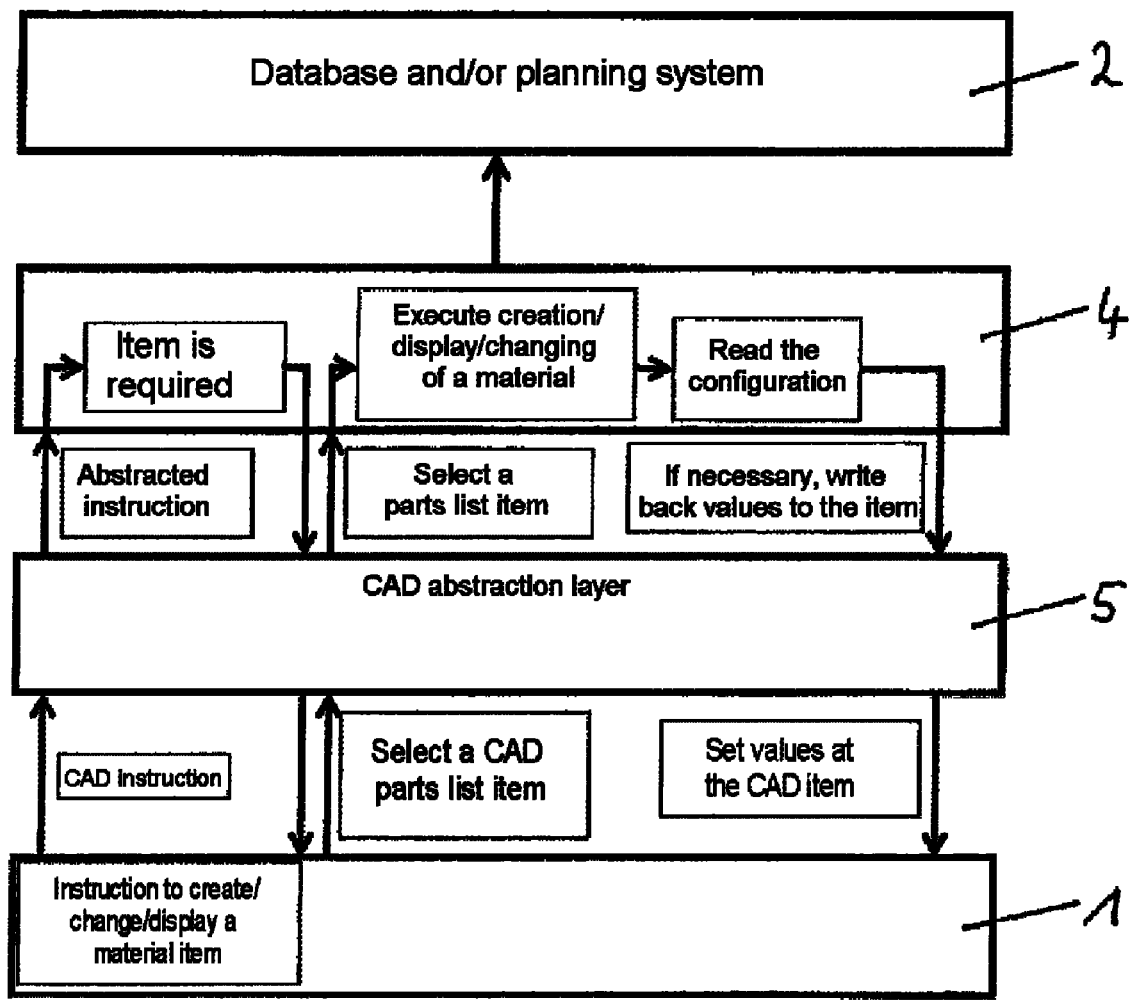
FIG. 7 shows an illustration of the interface module for another exemplary embodiment for creating, changing and displaying the material of a parts list item.

In this sequence illustrated in FIG. 7, functions which resort to material and/or article information from the back-end system are carried out with a parts list item in CAD.

For this purpose, the user starts an instruction in the CAD system.

The useful layer 4 now requires the selection of a parts list item.

The CAD abstraction layer 5 then converts the request into a CAD-specific request. Parts list functions of the CAD API are used in CAD systems having their own parts list management such as AutoCAD Mechanical or Inventor. The CAD abstraction layer 5 itself provides simple parts list management in CAD systems without their own parts list management such as AutoCAD without add-ons or MicroStation. For this purpose, CAD objects with particular properties, for example AutoCAD blocks with particular block names, are considered and treated as parts list items.

A parts list item in the CAD system has property fields which can be read and written to by the interface.

Key field(s) which uniquely identify(ies) the object in the back-end system 2

Copied fields from the back-end system 2 which are intended for processing in the CAD system or for providing the user with information, for example a short text. Which fields are mapped in this case can be defined by a configuration in the useful layer 4 or in the back-end system 2

Fields containing information from the CAD system which are intended to be transferred to the back-end system 2, for example for material/article creation, for synchronization or for the parts list creation/parts list update in the back-end system 2. Which fields are mapped in this case can be defined by a configuration in the useful layer 4 or in the back-end system 2.

These fields are now read and processed by the useful layer 5 and the desired functions are called in the back-end system 2.

After the function has ended, information is also written from the back-end object back into the CAD parts list item again if necessary:

Key fields in the case of creation or allocation of an object

Other fields from the back-end system 2 which are intended to be present as information in the CAD system.

The fourth example shows the transmission of a structure.

Figure 8:
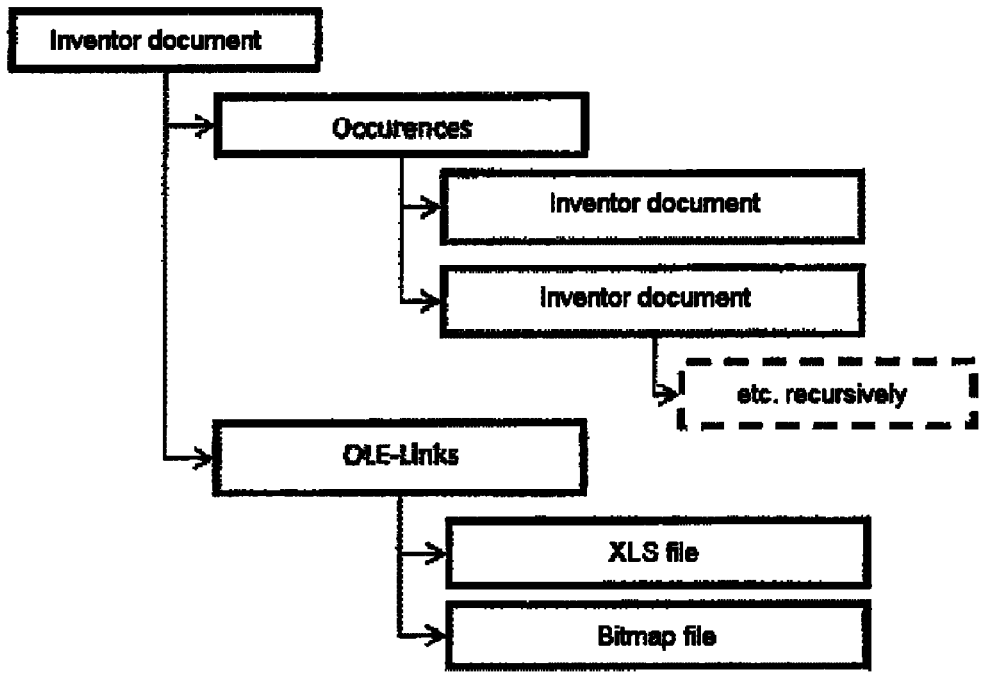
FIG. 8 shows a depiction of a structure in the CAD system.

In order to make it possible to manage a 3D structure and generally a CAD file with dependent files, this structure of dependencies must be read and stored in the back-end system. FIG. 8 shows an example of how a structure in the CAD system 1 can be mapped.

Figure 9:
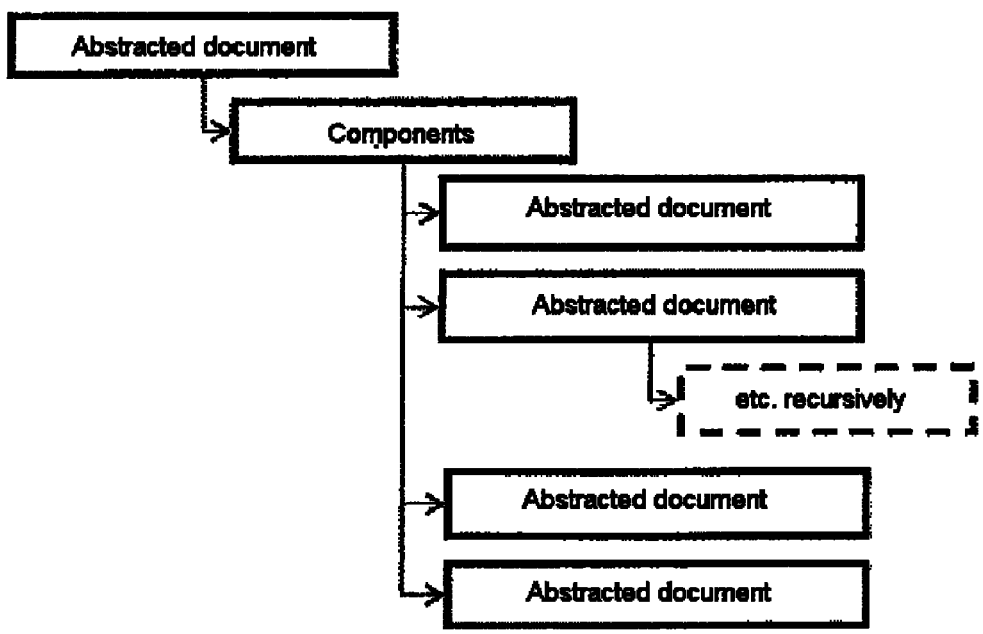
FIG. 9 shows a depiction of a structure in the CAD abstraction layer.

This structure in the CAD system 1 is converted into a structure illustrated in FIG. 9 in the CAD abstraction layer 5.

The CAD abstraction layer 5 provides a separate structure. Even with the relationships between abstracted objects, the CAD specialties, for example the different types of dependencies, are hidden from the business logic layer.

This abstracted structure from FIG. 9 can now be used to transmit the structures to the back-end system 2, for example in order to create them as document parts lists in SAP, to display them on SAP's CAD desktop or to process them in another manner. The integration may likewise use the structures to display parts of the structure or the entire structure on its own user interface (side panel, external program), to carry out or process structure comparisons with the structures stored in the back-end system.

A linking of graphical elements is described in the fifth example.

The different CAD systems 1 and add-ons for these CAD systems contain a multiplicity of graphical and non-graphical elements which constitute a representation of objects which can also be managed in the back-end system 2. These may be, for example Blocks in AutoCAD
Cells in MicroStation
Areas in AutoCAD Architectural
Lines in AutoCAD
Pipelines in Plant 3D/P&ID and the like.

These elements contain data in the CAD system 1, sometimes additionally data in an application-specific database, and sometimes graphical information, for example an exact border. Some elements are identical to the displayed element (pipe, architectural area), and others are only a representative (block in AutoCAD with meta data).

The CAD abstraction layer 5 now provides neutral access to an object and its properties. This makes it possible to access all properties in the same manner irrespective of whether these properties come from an attribute, a database field or a graphical calculation (area).

These neutral objects can now be linked to objects in the back-end system 2, for example technical spaces, items of equipment, architectural objects, or materials in SAP. The useful layer can hard code this assignment or make it freely configurable, as a result of which it is easily possible to incorporate further target objects. A computer in the back-end system 2 of SAP, which is modeled in the CAD system 1, can thus be depicted as an item of equipment which can now be assigned further data, for example type, build year, installed software and other information.

The linking can be carried out by searching for or newly creating objects in the back-end system 2 with subsequent allocation of key fields. However, it can also be carried out by manually changing a key field. A search can also use the values which have already been set on the abstracted CAD object in order to achieve a semiautomatic or fully automatic assignment.

Figure 10:
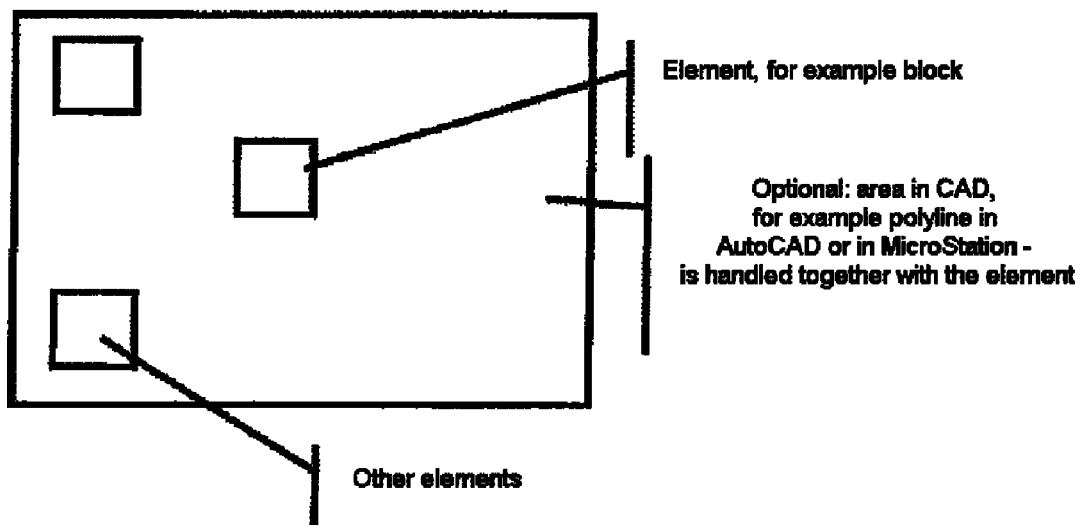
FIG. 10 shows an exemplary illustration for linking graphical elements.

For the CAD abstraction layer 5, it is likewise possible to handle an area or a polygon, which actually represents a separate element, together with a block which likewise represents a separate element. From the point of view of the useful layer 4, it therefore seems as if the element "block", which is hidden behind the neutral object, has an area. FIG. 10 illustrates an example of this.

An element can be assigned to an area by means of automatic detection. Conditions such as a block name, a drawing layer name, contents of fields, or detection that there is an element inside an area can be taken into account in this case.

An element can also be assigned by means of a user assignment, as a result of which an element can also lie outside an area if the area is too small.

An item of information relating to whether other elements are inside the area, are just inserted into the area, are moved from the area or are deleted is likewise provided. This makes it possible for the useful layer 4 to update relationships between objects in the back-end system 2 synchronously or on request without knowledge of graphical information.

For example, an item of equipment can be created when inserting an accordingly configured block, the status can be set to invalid when deleting a block and the equipment can be removed from a technical space when shifting the block from the area of another block.

The sixth example describes the processing of projects.

In some CAD systems 1, it is not sufficient to consider CAD documents and their referenced files; in this case, a plurality of CAD documents must be considered as a set of documents.

This is the case, for example, in Plant 3D where a plurality of CAD documents are assigned to a Plant 3D project. The project in turn has further files such as configuration files or databases.

In AutoCAD Electrical, there are electrical projects which manage CAD files together with other additional files.

In standard AutoCAD, there are so-called sheet sets which can be used to output files together or to enable faster access to associated files.

It is therefore no longer sufficient to consider the structures of the CAD documents.

The solution involves providing a function for the useful layer 2 on the abstracted CAD document, which function answers the question of whether the CAD document belongs to a superordinate "bracket object", and, if so, making it possible to access an abstracted "project" object which then in turn again allows access to all referenced documents.

The useful layer 2 can therefore "move upward", for example in the structure in FIG. 2 or 5, irrespective of the specific type of "bracket" (project, sheet set) of a given document and can resolve the complete structure from the superordinate project, instead of from the loaded document.

This makes it possible to handle the documents combined by the project together in the back-end system 2, such as the storage of the structure, common checking-in or checking-out, etc.

The seventh example describes the processing of additional files.

Some CAD files have additional referenced files which belong only to this CAD file and cannot be sensibly used alone or referenced by other CAD files. Examples are the so-called IDV files in older Inventor versions, referenced old drawings in MicroStation and simulation files in Inventor. Since these are not intended to receive a separate document info record in the back-end system 2 as far as possible but rather are intended to be assigned as an additional original in the document info record of the CAD file, the CAD abstraction layer 5 does not display these files as referenced files but rather as an additional file for the CAD file.

Figure 11:
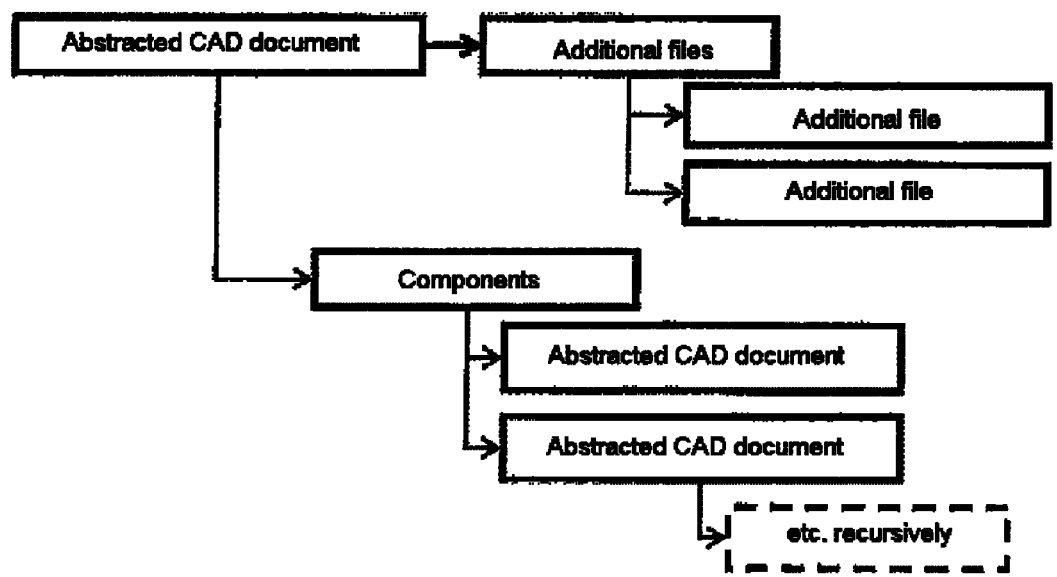
FIG. 11 shows a depiction of a further structure in the CAD abstraction layer with managed additional data.

FIG. 11 illustrates an example of such a structure.

Additional files for projects such as project databases, project configuration files and others are also processed in this manner.

LIST OF REFERENCE SYMBOLS

1 CAD system
2 Database and/or planning systems
3 Interface module
4 Useful layer
5 CAD abstraction layer
6 Additional modules, customer-specific/CAD-specific or with an additional option which can be ordered
7 Communication libraries
8 First interface
9 Second interface
10 Software or interface module according to the prior art

The invention claimed is:

1. A method for coupling a CAD system to a database and planning system for interchanging data between both systems, wherein the method includes providing a first CAD-side interface operating with a first communication protocol and a second database-side interface operating with a second communication protocol, and converting the data from the first communication protocol to the second communication protocol or vice versa between the first and second interfaces, wherein an interface module is provided that comprises at least one CAD abstraction layer and a useful layer and wherein the conversion between the communication protocols is carried out in two substeps in such a manner that the data are converted from the first communication protocol in the CAD abstraction layer to a third communication protocol and are then converted from this third communication protocol to the second communication protocol in the useful layer or vice versa and wherein the CAD file together with data from the CAD system that depends on the CAD file are managed within the interface module such that their structure is read out and stored as an abstracted structure and are converted into the format of the database or planning system based on the abstracted structure.

2. The method of claim 1, wherein steps for adapting the communication by means of communication libraries are carried out when converting the data from the third communication protocol to the second communication protocol or vice versa.

3. The method of claim 1, wherein the conversions between the communication protocols are carried out taking into account further CAD-specific or customer-specific specifications.

4. The method of claim 1, wherein a plurality of CAD documents is considered as a set of documents in a project which includes configuration data, database data, or both, such projects are processed so that information of a CAD document belongs to a higher-level object and is provided by an abstracted structure of a project enabling access to the abstracted object and all corresponding CAD documents.

5. The method of claim 1, wherein a CAD event generated by the CAD system and transmitted to the CAD abstraction layer is converted within the CAD abstraction layer into a neutral CAD event which is processed within the useful layer by connected modules.

6. The method of claim 1, further comprising storing commands abstracted in the CAD abstraction layer, transmitting a command to the CAD abstraction layer when at least one command is selected in the CAD system, converting the command by the CAD abstraction layer into an abstracted command, and transmitting the command to connected modules in the useful layer.

7. The method of claim 6, wherein the useful layer informs the CAD abstraction layer about the abstracted commands, the abstraction layer provides these commands for calling-off by an entry into the CAD menu or inserting into a toolbar or by a command called from scripts.

* * * * *